United States Patent
Dhulla et al.

(10) Patent No.: US 10,217,889 B2
(45) Date of Patent: Feb. 26, 2019

(54) CLAMPED AVALANCHE PHOTODIODE

(71) Applicant: Voxtel, Inc., Beaverton, OR (US)

(72) Inventors: Vinit Dhulla, Hillsboro, OR (US); Drake Miller, Lake Oswego, OR (US); Leonard Forbes, Corvallis, OR (US)

(73) Assignee: LadarSystems, Inc., Beaverton, OR (US)

( * ) Notice: Subject to any disclaimer, the term of this patent is extended or adjusted under 35 U.S.C. 154(b) by 0 days.

(21) Appl. No.: 15/008,321

(22) Filed: Jan. 27, 2016

(65) Prior Publication Data

US 2016/0218236 A1 Jul. 28, 2016

Related U.S. Application Data

(60) Provisional application No. 62/108,198, filed on Jan. 27, 2015.

(51) Int. Cl.
*H01L 31/107* (2006.01)
*H01L 27/144* (2006.01)
*H01L 29/872* (2006.01)

(52) U.S. Cl.
CPC ........ *H01L 31/107* (2013.01); *H01L 27/1443* (2013.01); *H01L 27/1446* (2013.01); *H01L 29/872* (2013.01)

(58) Field of Classification Search
CPC ............ H01L 31/107; H01L 27/14643; H01L 27/14636; H01L 27/1463
USPC ......................................................... 257/438
See application file for complete search history.

(56) References Cited

U.S. PATENT DOCUMENTS

| | | | | |
|---|---|---|---|---|
| 5,396,325 A * | 3/1995 | Carome | ............... | G01N 21/648 356/128 |
| 5,569,614 A * | 10/1996 | Kataoka | ............ | H01L 21/28537 148/DIG. 140 |
| 2007/0158778 A1* | 7/2007 | Kitabatake | .......... | H01L 21/8213 257/493 |
| 2009/0020826 A1* | 1/2009 | Huang | .................. | H01L 29/782 257/371 |
| 2013/0099091 A1* | 4/2013 | Nemirovsky | .......... | H01L 31/024 250/206 |
| 2014/0118730 A1* | 5/2014 | Kavaldjiev | .......... | H01L 27/1446 356/237.5 |
| 2014/0339398 A1* | 11/2014 | Mazzillo | ............... | H01L 31/107 250/208.2 |

* cited by examiner

*Primary Examiner* — Marc Armand

(57) ABSTRACT

An avalanche photodiode device operated in Geiger-mode, the device comprising a P-N junction formed on a substrate with a first semiconductor region and a second semiconductor region with an anode and cathode. The device further comprising a third semiconductor region, the third semiconductor region in physical contact with the second region, not in physical contact with the first region, and being the same semiconductor-type as the first semiconductor region. Additionally comprising a diode on the second semiconductor region and having a turn-on voltage than the P-N junction.

20 Claims, 7 Drawing Sheets

CLAMPED AVALANCHE PHOTODIODE

RELATED APPLICATIONS

This application claims benefit to U.S. Provisional Application No. 62/108,198 filed on Jan. 27, 2015.

TECHNICAL FIELD OF THE DISCLOSURE

The present disclosure relates in general to photonic detectors. This disclosure relates in particular to avalanche photodiodes operated in Geiger-mode, also known as single-photon avalanche diodes (SPAD).

DISCUSSION OF BACKGROUND ART

Avalanche Photodiodes are highly sensitive photonic detectors. Avalanche photodiodes are reverse biased solid state devices with high electric field. When a photon of sufficient energy is absorbed in the device where the field exists, an electron-hole pair is generated under the influence of this field, resulting in photocurrent. If this field is sufficiently high, one of the carriers accelerates and gains sufficient energy to collide with the crystal lattice and generate another electron-hole pair. This process is known as impact ionization. The electron or hole can accelerate again, as can the secondary electron or hole, and create more electron-hole pairs, resulting in an avalanche. This process is called avalanche multiplication. When the avalanche photodiode is biased below breakdown, the rate at which electron-hole pairs are generated is lower than the rate at which they exit the field and are collected. Therefore each absorbed photon creates on average a finite number of electron-hole pairs, proportional to the bias, which is the gain of the avalanche photodiode. When the avalanche photodiode is biased above breakdown voltage, this mode of operation is called Geiger mode.

Geiger-mode avalanche photodiodes are biased above the breakdown voltage and thus have very high electric field. In this mode, when a photon is absorbed in the high field region, the electrons and holes multiply faster by impact ionization then they can be extracted, therefore the avalanche is self-sustaining and the gain is infinite, until the avalanche is stopped. In order to detect another photon or carrier event, the avalanche must be stopped or quenched. Once avalanche is detected, it is typically quenched by momentarily lowering the bias below breakdown voltage and then increasing it back to above breakdown, after the avalanche is quenched.

SUMMARY OF THE DISCLOSURE

The present disclosure is directed to Geiger-mode avalanche photodiodes. In one aspect, the device comprises of a P-N junction formed on a substrate with a first semiconductor region and a second semiconductor region with an anode and cathode. The device further comprises a third semiconductor region, the third semiconductor region in contact with the second region, not in contact with the first region, and being the same semiconductor-type as the first semiconductor region. The device further comprises a diode on the second semiconductor region and having a turn-on voltage lower than the P-N junction.

BRIEF DESCRIPTION OF THE DRAWINGS

The accompanying drawings, which are incorporated in and constitute a part of the specification, schematically illustrate preferred embodiments of the present disclosure, and together with the general description given above and the detailed description of preferred methods and embodiment given below, serve to explain principles of the present disclosure.

DETAILED DESCRIPTION OF THE DISCLOSURE

Figure 1A:
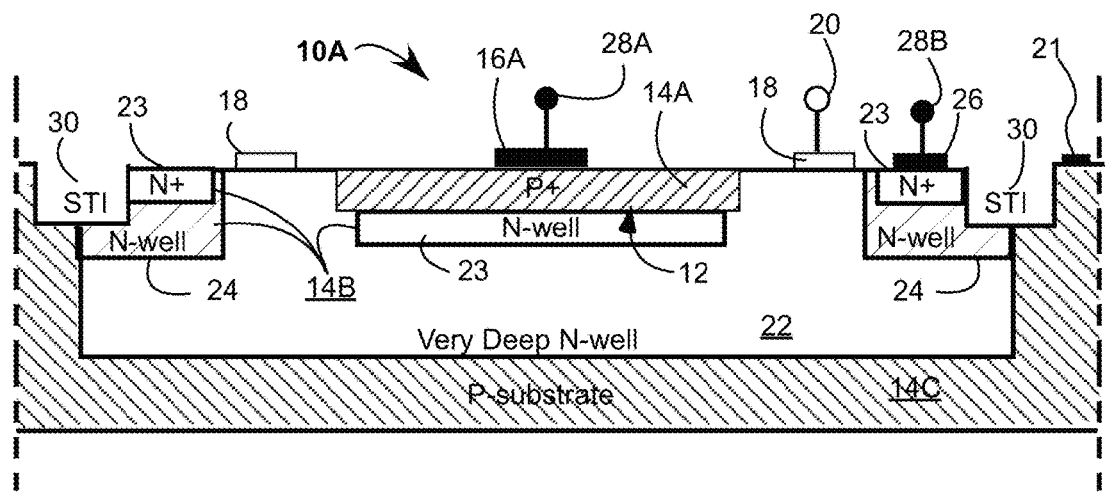
FIG. 1A is a cross-section view schematically illustrating an avalanche photodiode device operated in Geiger-mode, the device comprising a P-N junction formed on a substrate with a first semiconductor region and a second semiconductor region with an anode and cathode, a third semiconductor region, the third semiconductor region in physical contact with the second region, not in physical contact with the first region, and being the same semiconductor-type as the first semiconductor region and a diode on the second semiconductor region and having a turn-on voltage lower than the P-N junction.

Referring now to the drawings, wherein like components are designated by like reference numerals. Devices and methods of manufacture are described further herein below.

Figure 1B:
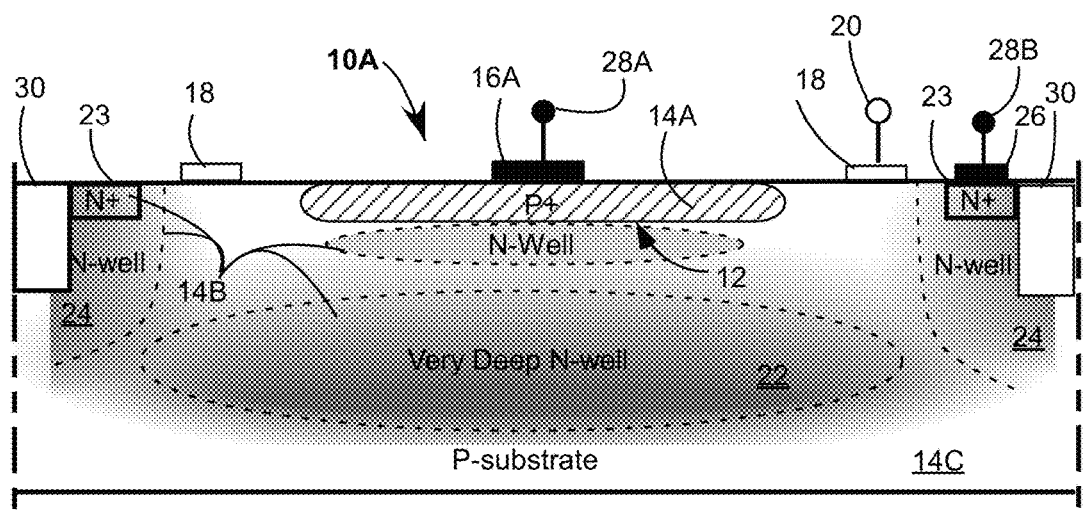
FIG. 1B is a cross-section view illustrating the dopant gradients of that shown in FIG. 1A.

FIG. 1A and FIG. 1B schematically illustrates a device 10A, an embodiment of the present disclosure. Device 10A is an avalanche photodiode device operated in Geiger-mode. FIG. 1A conceptually depicts the device. Rectangles refer and distinguish doping areas and regions, although such strict borders do not exist in actual devices. FIG. 1B depicts the areas and regions with dashed lines and concentration of N-type carriers as darker regions, depicting the device in a more accurate manner.

Device 10A comprises of a P-N junction 12, the P-N junction formed on a substrate by a first semiconductor region 14A and a second semiconductor region 14B. A third semiconductor region 14C is in contact with the second region, is not in contact with first semiconductor region 14A, and is the same semiconductor-type as first semiconductor region 14A. A diode contact 18 is on the substrate surface of the second semiconductor region. Diode contact 18 prevents forward bias of the substrate-cathode P-N junction as will be described further hereinbelow.

Diode contact 18 is can be electrically connected to an external bias or in direct electrical communication to the third semiconductor region 14C. The diode contact is shown as a single pad, but this is not a requirement. The diode contact can be shaped as a single pad, a continuous ring, or any other shape symmetric or not. In some embodiments the diode contact is a Schottky contact formed on the semiconductor substrate by metal deposition thereby forming a metal-semiconductor junction. The turn-on and forward bias voltages of the Schottky contact can be tuned by the materials used, deposition techniques, and the doping level of the semiconductor material to which is will be making contact.

In this example, first semiconductor region 14A and third semiconductor region 14C are P-type and second semiconductor region 14B is N-type. The third semiconductor region is preferably the same type as the substrate but could alternatively be formed in intrinsic or oppositely doped extrinsic substrates via ion implantation, epitaxial growth or deposition techniques. For instance, if the semiconductor substrate is intrinsic or extrinsic, but lightly doped, then conductivity type can be made the same as that of the first semiconductor region. Device 10A has a configuration referred to as P on N in P-substrate. N on P in N substrate can also be implemented and all discussion with respect to the P on N in P-substrate is applicable, with the anode and cathode swapping position.

Generally the substrate can be made from any semiconductor material that can form an avalanche photodiode. The spectral range will is based in part on the materials bandgap. Silicon is exemplified in the current disclosure as silicon is a popular substrate for Geiger-mode APD's and sophisticated CMOS processing allow monolithic integration. Similar devices can be made with other materials and underlying circuitry can be made by other materials. For instance, the underlying circuitry can be incorporated within the same material or later bonded to the avalanche photodiode. The underlying circuitry is commonly a CMOS readout integrated circuit (ROIC). Other non-limiting semiconductor materials include gallium arsenide (GaAs), gallium nitride (GaN), Germanium (Ge), Indium Gallium Arsenide (InGaAs), Indium Phosphide (InP), and InGaAsP—InP.

Second semiconductor region 14B comprises a very deep N-well region 22, an N-doped region 23, and a shallow N-well region 24. In one implementation, very deep N-well region 22 is deposited with sufficient implant energy such that a vertically graded dopant concentration is formed with the highest concentration of dopants at the bottom of the well and lowest concentration at the substrate surface, also referred to as a retrograde, exemplified by the gradients shown in FIG. 1B. N-well 24 is deposited at a depth such that it is in contact with very deep N-well 22. High concentration shallow N-doped region 23 is deposited at the surface and allows for ohmic contact to contact 26 with contact 26B in contact with a cathode 28B. The second semiconductor region comprising of the aforementioned interconnected N-type regions provides an electrical path from the surface of the substrate to the P-N junction.

In this example, first semiconductor region 14A is P-type with an anode 28A in contact with first semiconductor region 14A via a contact 16A. The second semiconductor region is N-type, cathode 28B is electrically connected to second semiconductor region 14B via a contact 26. Either of the contacts can be made from any material that can form low resistance ohmic contact with the underlying semiconductor region. The contact is most often formed from metal. Preferred material to make the contact will depend on the semiconductor material and process technology. For instance when the device is silicon based, the contacts are preferably a silicide followed by tungsten or aluminum. Here, anode 28A is shown centered on the device, but the anode can be located at any position in contact with the P-type first semiconductor region and is preferably located and sized sufficiently small to not block P-N junction 12 from light and minimize dead space. For instance, the anode can be positioned as a single contact on the perimeter or symmetric about the perimeter of the P-N junction still in contact with the P-doped first semiconductor region but outside of N-well region 23 such that the P-N junction is substantially free from obscurations to maximize optical exposure.

Isolation allows arrays of tightly spaced devices to be manufactured on a wafer as it reduces electrical and optical crosstalk and electric current leakage between neighboring devices on the substrate. Shallow trench isolation is one such isolation method. Other methods include deep trench isolation, trench fills, doping and hybrids. In device 10A, a shallow trench 30 provides isolation from any neighboring devices. For improved isolation, the bottom of trench 30 can be P-type doped, the trench could be filled with isolating material, or a deeper trench etched.

Figure 2A:
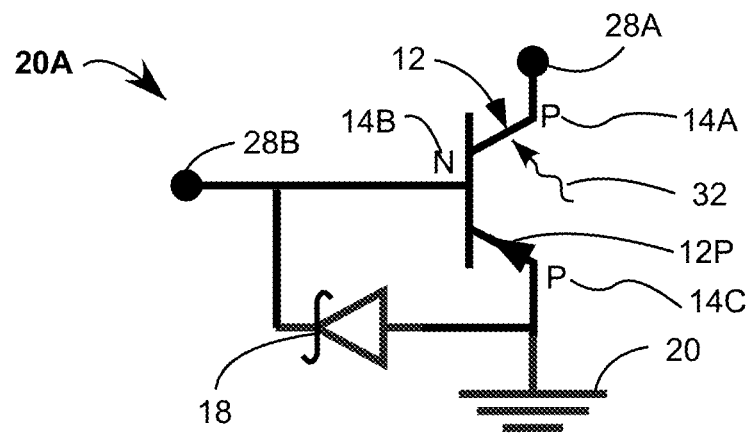
FIG. 2A is an electrical diagram or the device of that shown in FIG. 1A.
Figure 2B:
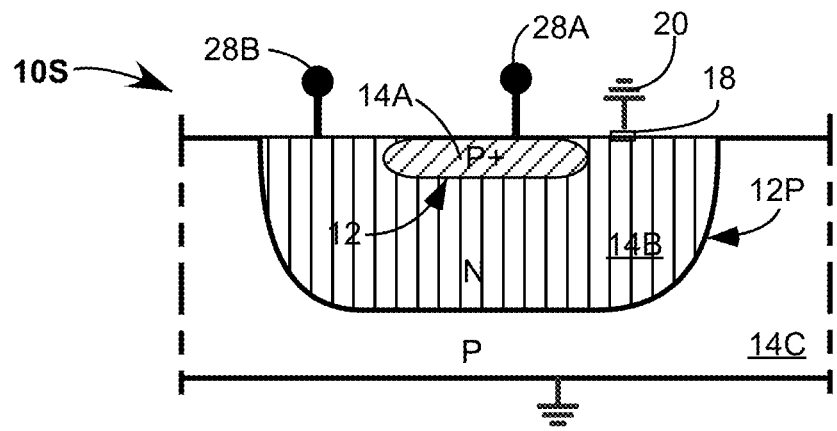
FIG. 2B is a simplified cross-section view of that shown in FIG. 1A.

FIG. 2A is an electrical diagram representing a simple electrical circuit 20A of a device 10S shown in FIG. 2B. Device 10S is a simplified cross-section view of the devices shown in FIG. 1A and FIG. 1B, schematically illustrating the location of components of the device referenced in FIG. 2A. Referring to both FIG. 2A and FIG. 2B operation of the device is explained. Device 20A is operated in Geiger-mode. Geiger-mode operation of an avalanche photodiode requires a reverse-bias voltage above the breakdown voltage. The breakdown voltage of a P-N junction is the voltage or bias large enough whereby impact ionization of electrons and holes multiply faster than they can be extracted, thereby establishing a self-sustaining avalanche triggered by a free carrier. Here, the bias is applied between anode 28A to a cathode 28B thereby reverse biasing first semiconductor region 14A and second semiconductor region 14B. When operated above the breakdown voltage, a single charge carrier, caused by absorption of a photon 32 in the depletion region of Geiger-mode P-N junction 12, can trigger the self-sustaining avalanche. A carrier is injected into the depletion layer by either absorption of a photon, thermally generated carriers, or trapped carriers. After the carrier triggers the Geiger-mode avalanche, the avalanche continues until the reverse-bias voltage is lowered below the breakdown voltage and carriers are cleared, which is referred to as quenching.

Quenching is done either actively or passively. Simple passive quenching can be performed by placing a sufficient resistor in series with the device. Active quenching uses active circuits to quickly detect the avalanche and then reduce the bias across the device. The time it takes for the device to functionally recover from an avalanche event is called dead time. Passive quenching usually has longer dead times than active quenching. During dead time the device cannot detect another photon. One consideration in the design of Geiger-mode avalanche photodiodes is minimization of dead time.

Passive quenching typically includes a high value resistor in series with the device. A bias above the breakdown voltage is applied continuously across the device and load resistor. After the device is triggered by a carrier, the avalanche starts and the current through the device causes a decrease in the bias voltage. The resistor-capacitor (RC) time constant over which this takes place is based on the series load resistor and the device's own capacitance. Initially a large voltage is built up across the load resistor, reducing the voltage drop across the device below the breakdown voltage. This reduction weakens the ionization process, thereby terminating the avalanche. After a delay determined by the RC constant the voltage is restored at or above the breakdown voltage and the device is ready to detect another photon.

Active quenching involves a circuit to sense the onset of the avalanche, actively quench the avalanche, and then restore the device for the next event. After the avalanche is triggered by a carrier, the circuit senses the onset of the avalanche and generates a digital output pulse. The circuit quenches the avalanche by momentarily lowering the bias below the breakdown voltage for a pre-determined time to stop the avalanche. This time is typically referred to as quench time. After the free carriers have been cleared the circuit raises the bias back above the breakdown, leaving the device ready to capture the next event. This time is typically referred to as reset time. Dead time is the sum of quench and reset time. In one biasing scheme of the active quenching, negative voltage is applied to the anode while the cathode is fixed at a positive voltage of 3.3V, such that sum of the anode and cathode voltage is at or above the breakdown voltage. The cathode is then modulated to from 3.3V to 0V to quench the device when an avalanche is detected. The above scheme can be reversed depending on the device design.

In general Geiger-mode devices are quick to recover with dead times in nanosecond timescales. The aforementioned effects such as the impact ionization can be in the picosecond timescale and transitory effects from fast changing electric fields can create problems. For instance, when the avalanche breakdown is initiated the P-N junction tends to act like a short circuit allowing carriers to enter the second semiconductor region. Carriers injected into the second semiconductor region cause the second semiconductor to reach ground potential or negative voltages with respect to the third semiconductor region. This effect can also occur during active quenching. After an avalanche, a transistor is used to drop the bias across the avalanching P-N junction in order to quench the device. The transistor generally drops the cathode from a positive bias, for instance 3V, to 0V. The active quenching circuit attempt to hold the cathode at 0V, but it can momentarily drop below 0V.

In either case, if the cathode is taken below zero volts, then second semiconductor 14B and third semiconductor region 14C could become forward biased acting as a parasitic emitter in a parasitic P-N-P type configuration. If the emitter becomes forward biased the parasitic emitter injects holes into the third semiconductor region which leads to increased dead time and can potentially manifest as after pulsing or false firing. If the bias increases above the parasitic emitter forward bias turn-on voltage the device may latch up in a permanently broken down state unable to recover. The latch up would require a shutdown of the device for future operation but could also render the device inoperable due to thermal damage from the high current during flowing through the parasitic emitter. Even if the cathode does not fall to the P-N junction turn-on voltage, even a small forward bias is sufficient to nonpreferred carriers into the second semiconductor region.

Here, diode contact 18 prevents the parasitic emitter from becoming forward biased. Diode contact 18 has a turn-on voltage below the P-N junction turn-on voltage and turns on before the parasitic emitter, preventing a large amount of current to flow into the third semiconductor region, thereby clamping the bias across the parasitic emitter to the turn-on voltage of the diode turn-on voltage, preventing forward bias of the parasitic emitter and otherwise avoiding long dead and recovery times in transistor switching and avoiding after pulsing or false signals in the next detection cycle. The diode turn-on voltage can be tailored or biased to have an effective turn-on voltage to prevent latch-up, reduce dead time, afterpulsing, of combinations thereof.

Figure 2C:
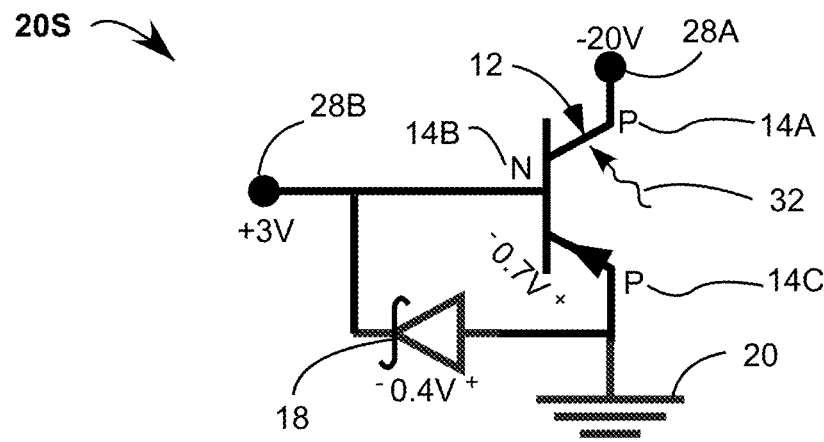
FIG. 2C is an electrical diagram, similar to that shown in FIG. 2A, further illustrating nominal breakdown voltages for a silicon based device.

For example FIG. 2C is an electrical diagram of silicon based device 20S. For silicon device 20S, parasitic junction 14C has a turn-on voltage of about 0.7V and Schottky contact 18 has a turn-on voltage of about 0.4V. Assuming an active breakdown voltage of 20V at P-N junction 14B, when the device is triggered by photon 32, then the avalanche will occur, forming a microplasma that will act like a short circuit for a transitory period driving electrons to the N-type second semiconductor region. A forward bias will result across parasitic emitter 14C, but will be clamped at a maximum of 0.4 volts by Schottky clamp 18, thereby reducing effects of the transitory forward bias, and preventing full forward bias of third semiconductor region 14C. In silicon, schottky clamp 18 preferably has n-type or p-type dopants in the concentration range of about 1e15 to about 1e18 dopants per cm^3, although other dopants ranges and combinations of dopants can be used.

Figure 3A:
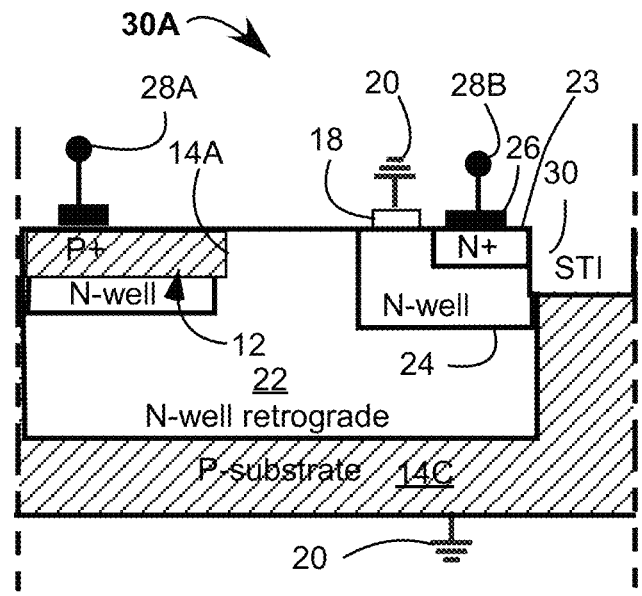
FIG. 3A is a cross-section view, illustrating the diode in another position.
Figure 3B:
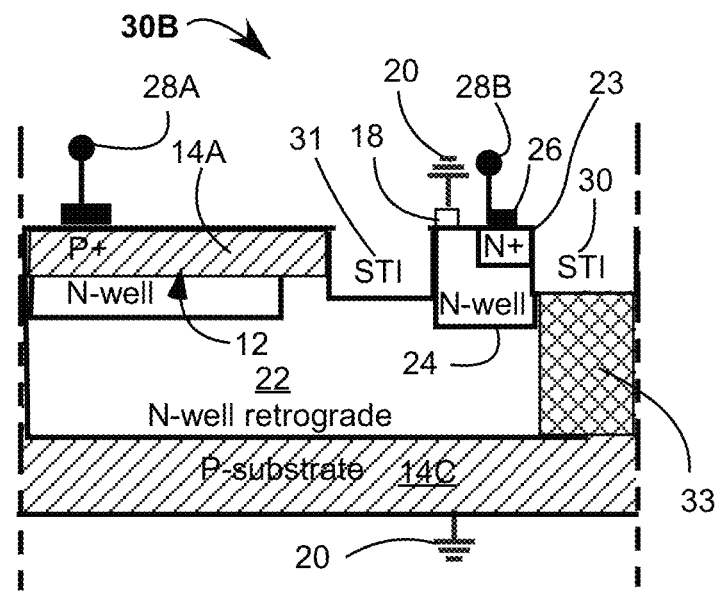
FIG. 3B is a cross-section view, illustrating an alternative diode position
Figure 3C:
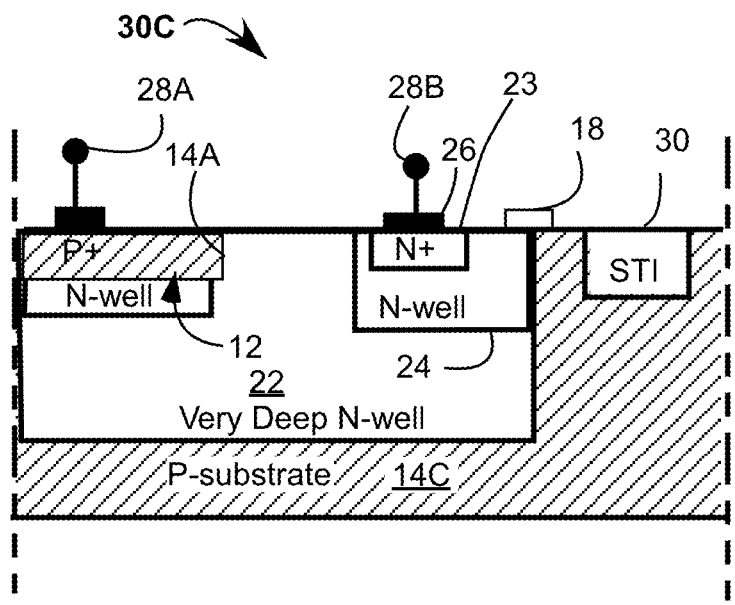
FIG. 3C is a cross-section view, illustrating yet another alternate diode position.

FIG. 3A is a half cross-section view of a device 30A. Device 30A is symmetric about left side of that illustrated. Here, the diode contact is a Schottky contact. Diode 18 is in contact with shallow N-well 24, spaced sufficiently apart from shallow N-well 23 as to not make a short. FIG. 3B is a half cross-section view of a device 30B. Device 30B is the same as that shown in FIG. 3B except for an additional shallow trench 31 between shallow N-well 24 and first semiconductor region 14A. Additionally shallow trench 30 has an implant 33 at the bottom which further isolates the device from any nearby devices. Referring to FIG. 3C, a device 30C has a diode contact 18, here a schottky contact, formed in connection to n-well 23 and third semiconductor region 14C.

Figure 4A:
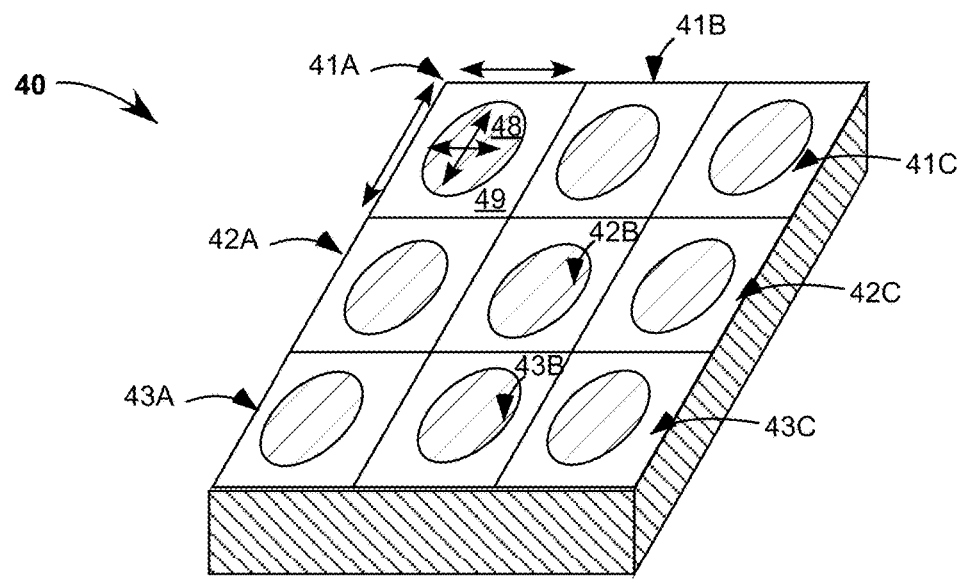
FIG. 4A is a perspective view, partly in cross-section, illustrating an array of Geiger-mode avalanche photodiodes
Figure 4B:
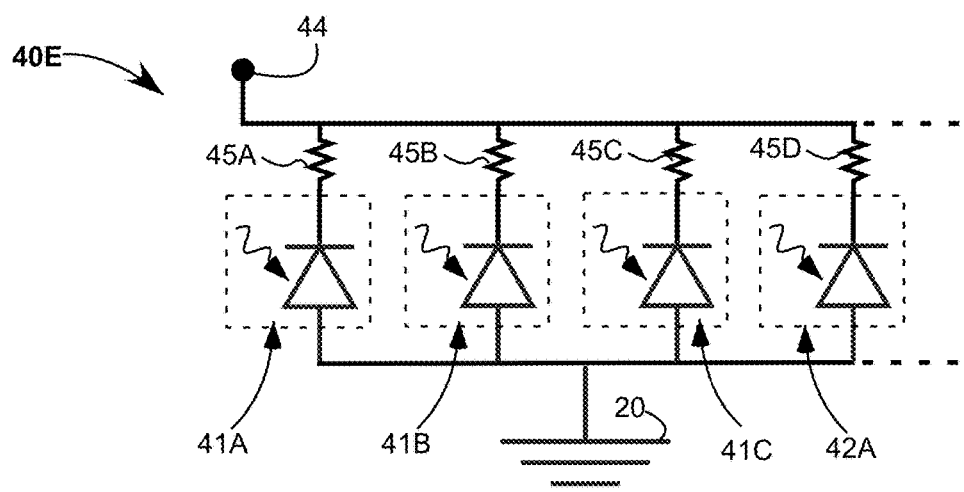
FIG. 4B is an electrical diagram of the device shown in FIG. 4A.

FIG. 4A is a perspective view, partly in cross section, of a Geiger-mode array 40. FIG. 4B is an electrical diagram 40E, illustrating the electrical interconnection of the devices of that shown in FIG. 4A. The aforementioned devices, with the Schottky diode, can be implemented in Geiger-mode array 40. Geiger-mode array 40 comprises of a device 41A, 42A, 43A, 41B, 42B, 43B, 41C, 42C and 42C. When coupled to a quenching resistor 45A, 45B, 45C, and 45D, for example, silicon specific arrays are called Silicon photomultipliers (SiPM). Interconnection of the individual devices to ground 20 and a common output 44 allows multiple photon detection.

Exemplary device 41A has a region 48, drawn as the darker region and dead space 49. In designing device array 40 the region 48 is maximized and dead space minimized. Minimization of the dead space allows greater density of the devices. In practice, a Geiger-mode array has many more individual interconnected devices than is shown. With more devices a larger area and greater dynamic range can be achieved.

Figure 5:
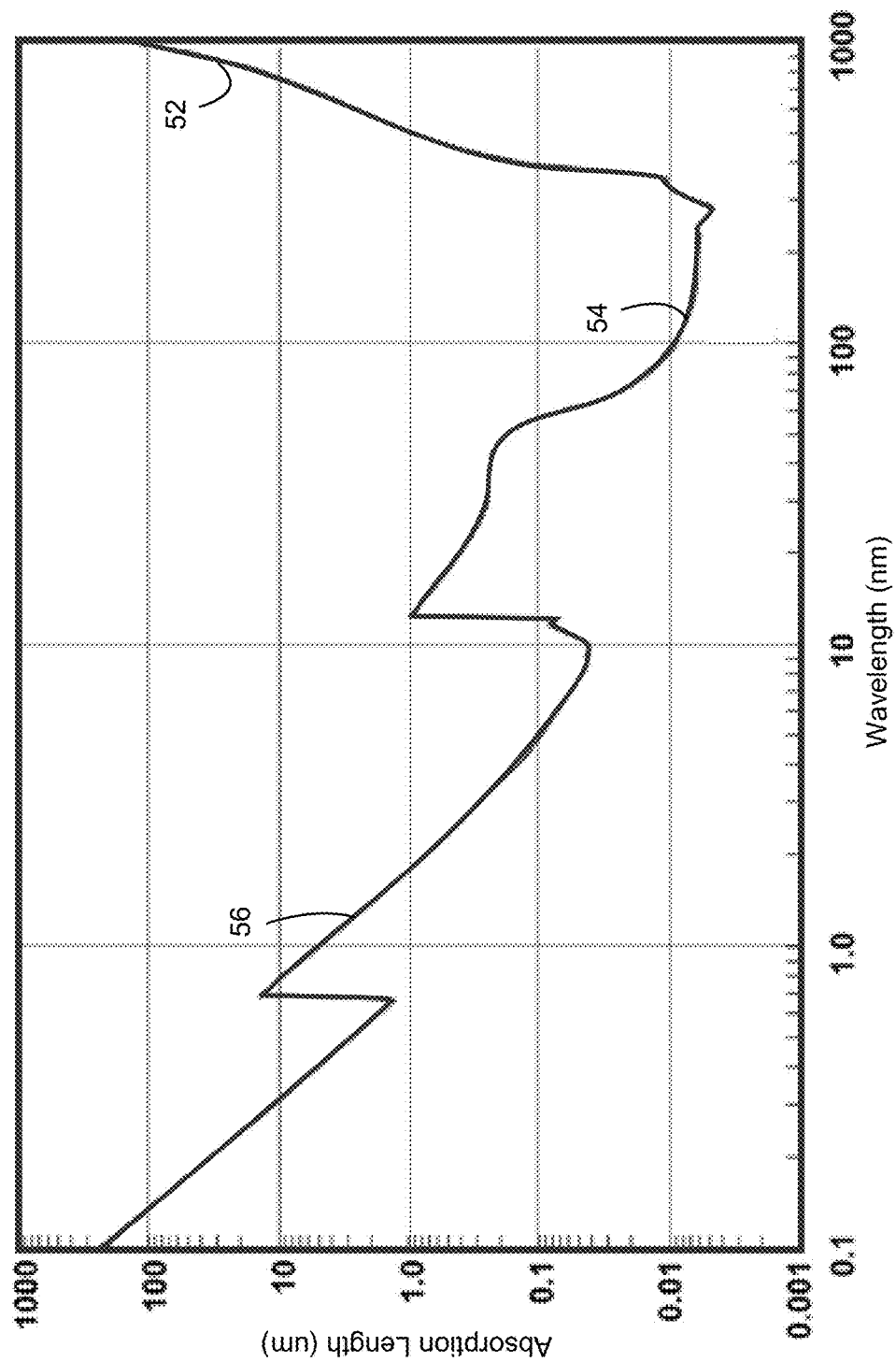
FIG. 5 is a chart showing the absorption length versus wavelength of silicon.

In all the aforementioned devices and variations a variety of techniques to enhance sensitivity can be implemented. Photons are preferably absorbed, and free carriers produced, in the electric field region of the P-N junction, but can be absorbed anywhere within the device. Semiconductor materials are transparent at wavelengths of light with energies below the semiconductors energy bandgap. By way of example, FIG. 5 is a graph 50 of absorption length versus wavelength for silicon. Wavelengths in an IR region 52 have a longer absorption length as silicon becomes more transparent closer to the energy bandgap. Alternatively as wavelength decreases to a UV region 54, the material absorption length decreases. Higher energy photons have increased absorption length shown in an x-ray region 56. Typically, the devices are manufactured on standard thickness semiconductor wafers. Depending on the application, the device can be thinned appropriately to increase absorption in the preferred photosensitive region. For instance, to allow UV wavelengths to reach the photosensitive region the device can be thinned with well-known back thinning processes. Alternatively a sensor can be thinned to allow double side illumination. Additionally, to increase sensitivity the device can be treated with a dielectric coating, a mirror coating, roughened, shaped, or a diffractive pattern can be applied.

Figure 6A:
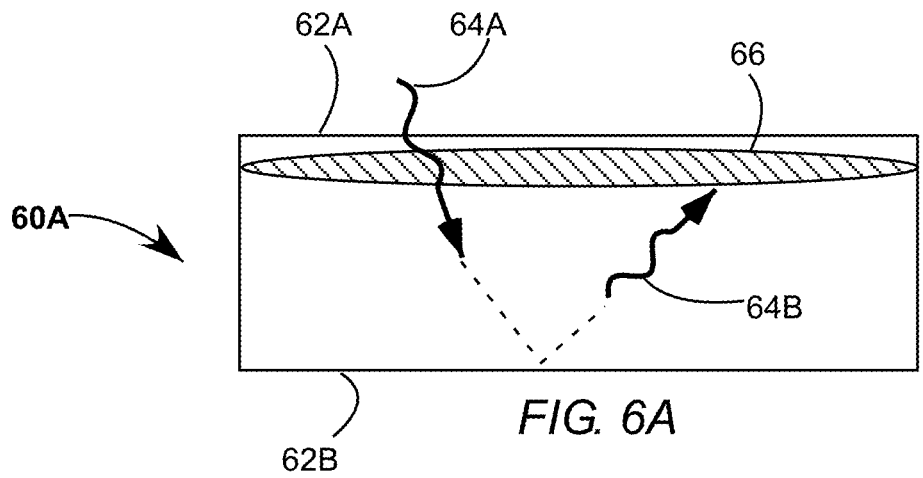
FIG. 6A is a cross-section view, showing a section of the device with a coating applied to the surfaces.

FIG. 6A is a cross-section view of a section of a device 60A. A photon 64A is incident upon a coated surface 62A. Coated surface 62A is antireflective and allows photon 64A to enter into the device. If not absorbed in a photosensitive region 66, photon 64 reflects off reflective coated surface 62B, directed back to the photosensitive region, shown as a photon 64B. Device 60A causes the photon to pass through the device twice, increasing the chance of absorption and thus photon efficiency. Alternative coatings include reflective, bandpass, shortpass, longpass, u-coating, v-coating, angle-dependent coating, a laser-line coating or any other coating designs. Other coating design could be implemented for environmental conditions such a scratch resistant, thermally conductive coating to protect the device, or scintillator coating with up converter or down converter materials to detect wavelengths that cannot otherwise be absorbed in the semiconductor material.

Figure 6B:
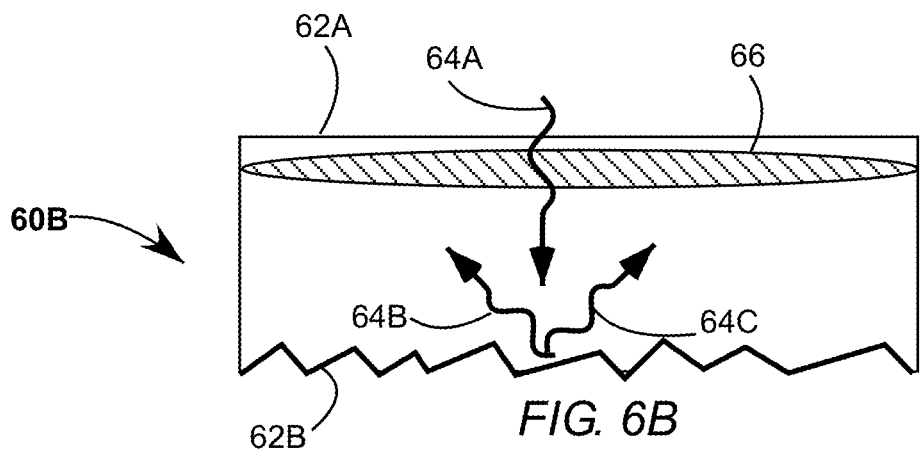
FIG. 6B is a cross-section view, showing a section of the device with a roughened surface.

FIG. 6B is a cross-section view is a cross-section view of a device 60B, similar to device 60A as shown in FIG. 6A. Here, surface 62B is roughened. Roughening of surface 62A scatters incident light at various angles dependent on the roughness. Here photon 64B and a photon 64C are scattered at oblique angles such that the photons are totally internally reflected and have a longer path length through photosensitive region 66, thereby increasing sensitivity of the device.

Figure 6C:
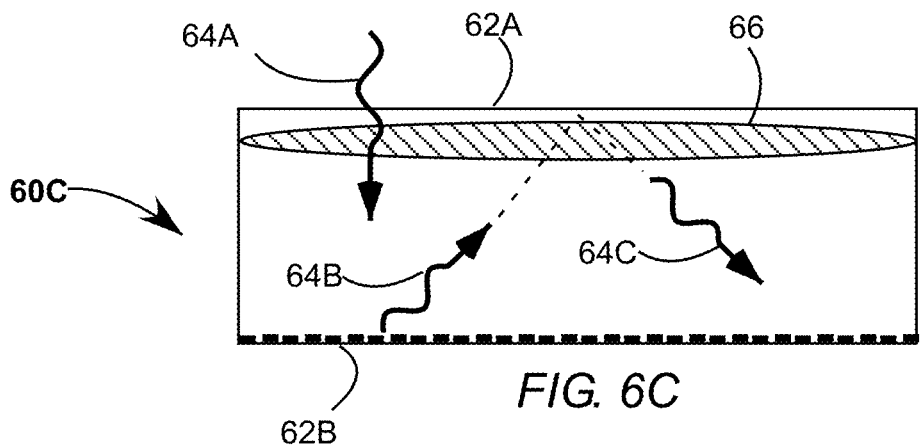
FIG. 6C is a cross-section view, showing a section of the device with a diffractive pattern applied to the surface of the device.

FIG. 6C is a cross section view of device 60C, similar to device 60A in FIG. 6A. Here surface 62B has a diffractive pattern which directs, or diffracts, incident light 64A at an oblique angle. Using the diffractive pattern allows control of the diffracted angle such that certain wavelengths can achieve total internal reflection within the device as shown by photon 64B, reflecting from surface 62A, shown as photon 64C. Other diffractive designs, such as diffractive lens can be used to concentrate photons on the PN junction.

The disclosed device has a variety of useful applications. In general it can be used for any application when there is a need for low light detection. It is especially well suited for single photon light levels. Specific applications include laser range finding, LIDAR/LADAR, medical imaging (such as Positron emission tomography), bio-medical imaging, fluorescence-lifetime imaging microscopy (FLIM), and high frame rate microscopy.

While some of the embodiments explained above are depicted with specific geometries and made with particular materials, one skilled in the art will recognize the disclosed devices can be built in any number of varying geometries and various materials. Modifications and changes can be made without departing to with the scope of the invention.

In addition the disclosed techniques can be implemented as an addition in many existing device designs.

In summary, the present invention is described above in terms of particular embodiments. The invention, however, is not limited to the embodiments described and depicted herein. Rather, the invention is limited only by the claims appended hereto.

What is claimed is:

1. An avalanche photodiode device operating in Geiger-mode, the device comprising:
   a P-N junction formed on a substrate with a first semiconductor region and a second semiconductor region with an anode and a cathode;
   a third semiconductor region, the third semiconductor region in physical contact with the second region, not in physical contact with the first region, and being the same semiconductor-type as the first semiconductor region; and
   a clamp diode on the second semiconductor region and having a turn-on voltage lower than the P-N junction.

2. The device of claim 1, wherein the clamp diode is a Schottky diode.

3. The device of claim 1, wherein the first semiconductor region is N-type.

4. The device of claim 1, wherein the substrate is from the group silicon, germanium, or indium phosphide.

5. The device of claim 1, wherein the clamp diode is in electrical communication with the third semiconductor region via a metal interconnect layer.

6. The device of claim 1, wherein the clamp diode is in electrical contact with the third semiconductor region via wire bonding.

7. The device of claim 1, wherein the diode turn-on voltage is optimized to reduce dead time, afterpulsing, latchup, or combinations thereof.

8. The device of claim 1, wherein the diode has a potential applied.

9. The device of claim 8, wherein the potential is modulated.

10. The device of claim 1, further comprising an isolation barrier.

11. The device of claim 10, wherein the isolation barrier is a trench.

12. The device of claim 1, wherein the substrate is back thinned.

13. The device of claim 1, wherein the substrate has a coating.

14. The device of claim 13, wherein the coating is a reflective, bandpass, shortpass, longpass, u-coating, v-coating, angle dependent coating, or laser-line coating.

15. The device of claim 1, wherein a diffractive pattern is incorporated on a surface of the device to direct radiation entering the device at oblique angles to cause total internal reflection within the device.

16. An avalanche photodiode device operating in Geiger-mode, the device comprising:
    An array of individual P-N junctions formed on a substrate with a first semiconductor region and a second semiconductor region with an anode and a cathode;
    a respective third semiconductor region, for each of the individual P-N junctions, the third semiconductor region in physical contact with the second region, not in physical contact with the first region, and being the same semiconductor-type as the first semiconductor region; and
    a respective clamp diode for each of the individual P-N junctions, wherein each of the clamp diodes are on each of the respective individual second semiconductors region and in electrical communication with the third semiconductor regions and each of the clamp diodes have a voltage drop than the P-N junction.

17. The device of claim 16, wherein the substrate has a coating that is reflective, bandpass, shortpass, longpass, u-coating, v-coating, angle dependent coating, or laser-line coating.

18. The device of claim 17, wherein the coating is different for at least two devices of the plurality of the array.

19. The device of claim 16, wherein the clamp diode is a Schottky diode.

20. The device of claim 1, wherein the clamp diode turn-on voltage is optimized to reduce dead time, after pulsing, latchup, or combinations thereof.

* * * * *